(12) United States Patent
Chaiken et al.

(10) Patent No.: US 12,416,686 B2
(45) Date of Patent: Sep. 16, 2025

(54) SYSTEMS AND METHODS FOR DETECTING MECHANICAL STRAIN ON A CIRCUIT BOARD (71) Applicant: Dell Products L.P., Round Rock, TX (US)

(72) Inventors: Craig L. Chaiken, Pflugerville, TX (US); Kuo-Chieh Lai, New Taipei (TW); Hong-Ling Chen, Taoyuan (TW); Hou-Chun Wang, Linkou Dist. (TW)

(73) Assignee: Dell Products L.P., Round Rock, TX (US)

( * ) Notice: Subject to any disclaimer, the term of this patent is extended or adjusted under 35 U.S.C. 154(b) by 194 days.

(21) Appl. No.: 18/170,664

(22) Filed: Feb. 17, 2023

(65) Prior Publication Data

US 2024/0280646 A1    Aug. 22, 2024

(51) Int. Cl.
*G01R 31/54* (2020.01)

(52) U.S. Cl.
CPC .................. *G01R 31/54* (2020.01)

(58) Field of Classification Search
CPC .................................................. G01R 31/54
See application file for complete search history.

(56) References Cited

U.S. PATENT DOCUMENTS

| | | | | |
|---|---|---|---|---|
| 4,683,422 | A | * | 7/1987 | Goodson ................ G01R 31/52 |
| | | | | 324/715 |
| 5,827,967 | A | * | 10/1998 | Ueyanagi ................ G01P 21/00 |
| | | | | 73/1.38 |
| 6,471,526 | B1 | * | 10/2002 | Harper, Jr. ............ H05K 7/1061 |
| | | | | 439/83 |
| 10,056,356 | B1 | | 8/2018 | Liu |
| 2010/0171510 | A1 | * | 7/2010 | Ren ..................... G01R 31/2815 |
| | | | | 324/120 |
| 2012/0134612 | A1 | * | 5/2012 | Snelick ................... F16C 19/52 |
| | | | | 384/448 |
| 2015/0059487 | A1 | * | 3/2015 | Ahmad .................... G01L 1/142 |
| | | | | 73/780 |
| 2017/0363674 | A1 | * | 12/2017 | Douglass ................ H01H 85/17 |
| 2019/0198480 | A1 | | 6/2019 | Kelly |
| 2023/0402293 | A1 | | 12/2023 | LoBianco |
| 2024/0280524 | A1 | | 8/2024 | Chaiken et al. |

FOREIGN PATENT DOCUMENTS

CN    209105455 U  *  7/2019

* cited by examiner

*Primary Examiner* — Lee E Rodak
*Assistant Examiner* — Demetrius R Pretlow
(74) *Attorney, Agent, or Firm* — Jackson Walker L.L.P.

(57) ABSTRACT

An information handling system may include a strain force fuse formed on a circuit board of the information handling system, the strain force fuse configured to experience an impedance discontinuity in response to a mechanical force applied to the circuit board at or proximate to the strain force fuse and a management controller electrically coupled to the strain force fuse and configured to provide out-of-band management facilities for management of the information handling system, the management controller further configured to detect whether the impedance discontinuity has occurred.

14 Claims, 6 Drawing Sheets

SYSTEMS AND METHODS FOR DETECTING MECHANICAL STRAIN ON A CIRCUIT BOARD

TECHNICAL FIELD

The present disclosure relates in general to information handling systems, and more specifically to detecting mechanical strain on a circuit board, for example a motherboard.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often employ one or more circuit boards. A circuit board may broadly refer to a printed circuit board (PCB), printed wiring board (PWB), printed wiring assembly (PWA) etched wiring board, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board. A circuit board may be used to implement a motherboard, a riser card, a mezzanine card, a paddle card, and/or many other components of an information handling system.

One problem sometimes experienced by circuit boards is small, sometime microscopic, solder cracks caused by excessive strain on a circuit board during the manufacturing process and/or rough handling of the circuit board after manufacturing. Such solder cracks are often invisible, even when using a microscope, but can result in information handling system failures when an information handling system (e.g., a laptop or notebook computer) is lifted, or when the circuit board operates within certain temperature ranges. Accordingly, systems and methods to detect the presence of such strain-induced open circuits may be desired.

SUMMARY

In accordance with the teachings of the present disclosure, the disadvantages and problems associated with detecting strain-induced open circuits on a circuit board may be reduced or eliminated.

In accordance with embodiments of the present disclosure, an information handling system may include a strain force fuse formed on a circuit board of the information handling system, the strain force fuse configured to experience an impedance discontinuity in response to a mechanical force applied to the circuit board at or proximate to the strain force fuse and a management controller electrically coupled to the strain force fuse and configured to provide out-of-band management facilities for management of the information handling system, the management controller further configured to detect whether the impedance discontinuity has occurred.

In accordance with these and other embodiments of the present disclosure, a method may include outputting a known signal on a first pin of a management controller electrically coupled to a strain force fuse formed on a circuit board of an information handling system, the strain force fuse configured to experience an impedance discontinuity in response to a mechanical force applied to the circuit board at or proximate to the strain force fuse. The method may also include receiving an input signal on a second pin of the management controller electrically coupled to the strain force fuse and determining if the impedance discontinuity exists based on whether the input signal is equivalent to the known signal.

In accordance with these and other embodiments of the present disclosure, an article of manufacture may include a computer readable medium and computer-executable instructions carried on the computer readable medium, the instructions readable by a processor, the instructions, when read and executed, for causing the processor to, in a management controller of an information handling system, wherein the management controller is configured to provide out-of-band management facilities for management of the information handling system: (i) output a known signal on a first pin of the management controller electrically coupled to a strain force fuse formed on a circuit board of the information handling system, the strain force fuse configured to experience an impedance discontinuity in response to a mechanical force applied to the circuit board at or proximate to the strain force fuse; (ii) receive an input signal on a second pin of the management controller electrically coupled to the strain force fuse; and (iii) determine if the impedance discontinuity exists based on whether the input signal is equivalent to the known signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage one or more communications ports for communicating with external devices as well as various input/output ("I/O") devices, such as a keyboard, a mouse, and a video display. The information handling system may also include one or more busses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, BIOSs, buses, memories, I/O devices and/or interfaces, storage resources, network interfaces, motherboards, and/or any other components and/or elements of an information handling system.

For the purposes of this disclosure, a circuit board may broadly refer to a printed circuit board (PCB), printed wiring board (PWB), printed wiring assembly (PWA) etched wiring board, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
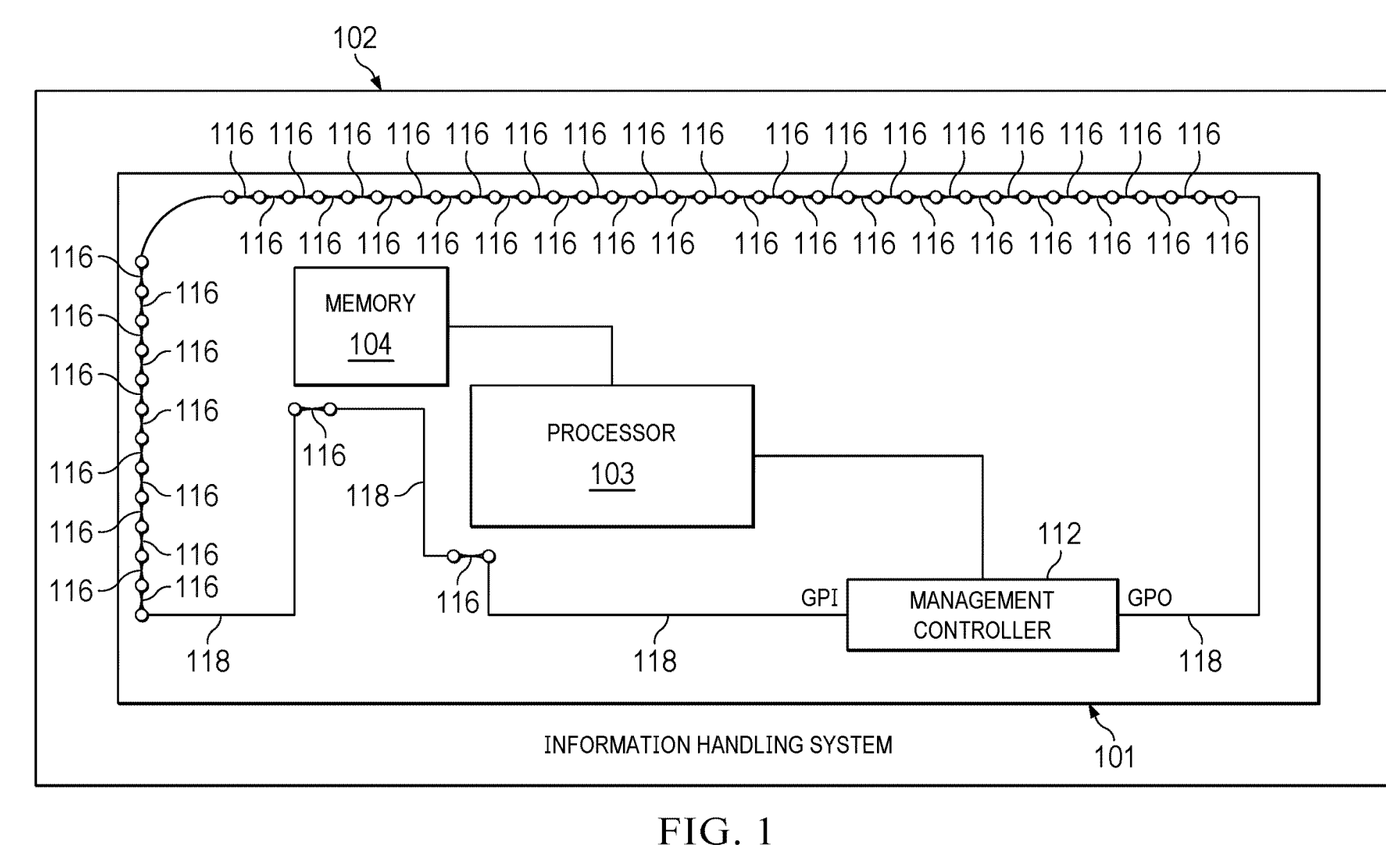
FIG. 1 illustrates a block diagram of selected components of an example information handling system, in accordance with certain embodiments of the present disclosure.

FIG. 1 illustrates a block diagram of selected components of an example information handling system 102, in accordance with certain embodiments of the present disclosure. It is noted that the various components depicted in FIG. 1 may not be drawn to scale.

In some embodiments, information handling system 102 may comprise a server. In other embodiments, information handling system 102 may be a personal computer (e.g., a desktop computer, a laptop, notebook, tablet, handheld, smart phone, personal digital assistant, etc.). As depicted in FIG. 1, information handling system 102 may include a circuit board 101 (e.g., a motherboard or backplane) having mounted and/or formed thereon a processor 103, a memory 104 communicatively coupled to processor 103, a management controller 112 communicatively coupled to processor 103, and one or more strain force fuses 116 electrically coupled to management controller 112.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Management controller 112 may be configured to provide out-of-band management facilities for management of information handling system 102. Such management may be made by management controller 112 even if information handling system 102 is powered off or powered to a standby state. Management controller 112 may include a processor, memory, out-of-band network interface separate from and physically isolated from an in-band network interface of information handling system 102, and/or other embedded information handling resources. In certain embodiments, management controller 112 may include or may be an integral part of a baseboard management controller (BMC) or a remote access controller (e.g., a Dell Remote Access Controller or Integrated Dell Remote Access Controller). In other embodiments, management controller 112 may include or may be an integral part of a chassis management controller (CMC). In yet other embodiments, management controller 112 may include or may be an integral part of an embedded controller (EC). Management controller 112 may include firmware comprising a program of executable instructions configured to be read and executed by management controller 112 in order to carry out the functionality of management controller 112, including functionality of management controller 112 described herein.

Figure 2:
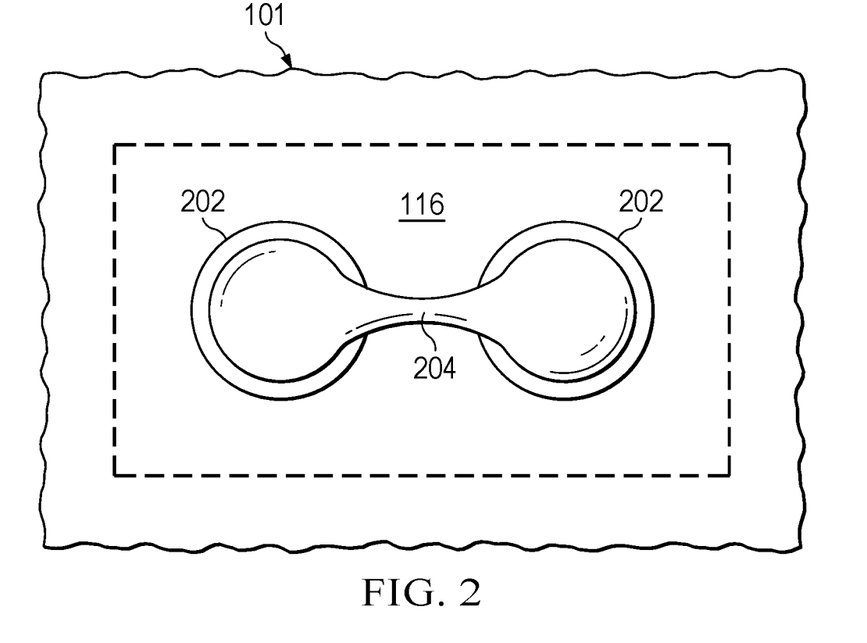
FIG. 2 illustrates a top plan view of selected components of a strain force fuse formed on a circuit board, in accordance with certain embodiments of the present disclosure.

As shown in FIG. 1, one or more strain force fuses 116 may be printed on circuit board 101. FIG. 2 illustrates a top plan view of selected components of a strain force fuse 116 formed on circuit board 101, in accordance with certain embodiments of the present disclosure. As shown in FIG. 2, a strain force fuse 116 may be formed by applying solder paste 204 between two adjacent test pads 202 on a substrate area of circuit board 101. In some embodiments, strain force fuses 116 may be printed on circuit board 101 (e.g., using surface mount technology printing).

Turning again to FIG. 1, some of strain force fuses 116 may have a common test pad 202 with one or more other strain force fuses 116. In addition, some strain force fuses 116 may be coupled to one another via traces 118 formed on circuit board 101.

As also shown in FIG. 1, strain force fuses 116 may be electrically coupled in a series configuration, with a general-purpose output (GPO) pin of management controller 112 coupled to a first electrical node at one end of the series configuration and a general-purpose input (GPI) pin of management controller 112 coupled to a second electrical node at the other end of the series configuration.

In operation, if a mechanical strain force or torsion is applied to circuit board 101 capable of cracking solder, one or more strain force fuses 116 may also break, resulting in an impedance discontinuity (e.g., open circuit). In order to detect whether such an impedance discontinuity has occurred, management controller 112 may output a known signal (e.g., logic high) on its GPO pin, and determine if the same signal is received at its GPI pin. If the known signal is received at the GPI pin, then no strain-force induced event is determined to have occurred. However, if the known signal is not received at the GPI pin, then a strain-force induced event may have occurred.

Although FIG. 1 depicts circuit board 101 having numerous strain force fuses 116 formed thereon, in some embodiments, a circuit board 101 may have fewer strain force fuses 116 formed thereon, with as few as one strain force fuse 116. In embodiments in which only one or a small few of strain force fuses 116 are formed on circuit board 101, such strain force fuses 116 may be formed proximate to areas of circuit board 101 at which the potential of strain force-induced damage to electrical components may occur, such as being located near processor 103, memory 104, and/or other information handling resources, for example to detect strain near ball grid arrays used to electrically couple processor 103, memory 104, and/or other information handling resources to circuit board 101.

Further, although not explicitly shown in FIG. 1, a desired sensitivity of a single strain force fuse 116 may be set by locating test pads 202 of a single strain force fuse 116 at a particular distance, as sensitivity of a strain force fuse 116 may be proportional to a distance between pads 202 of the strain force fuse 116.

In addition to processor 103, memory 104, management controller 112, and strain force fuses 116, information handling system 102 may include one or more other information handling resources.

Utilizing strain force fuses 116, management controller 112 may be able to detect both permanent fuse failures and intermittent fuse failures. A permanent fuse failure may be an impedance discontinuity present in one or more strain force fuses 116 even in the absence of mechanical forces applied to such one or more strain force fuses 116, indicating that such one or more strain force fuses 116 are permanently damaged and further indicating a possibility that circuit board 101 has undergone excessive strain in areas proximate to the one or more strain force fuses 116. An intermittent fuse failure may be an impedance discontinuity that intermittently appears, often only occurring when mechanical stress is applied to circuit board 101 (e.g., when a user lifts information handling system 102) to cause sufficient strain leading to such impedance discontinuity, and wherein such impedance discontinuity may be absent in the absence of an applied strain to circuit board 101.

Figure 3:
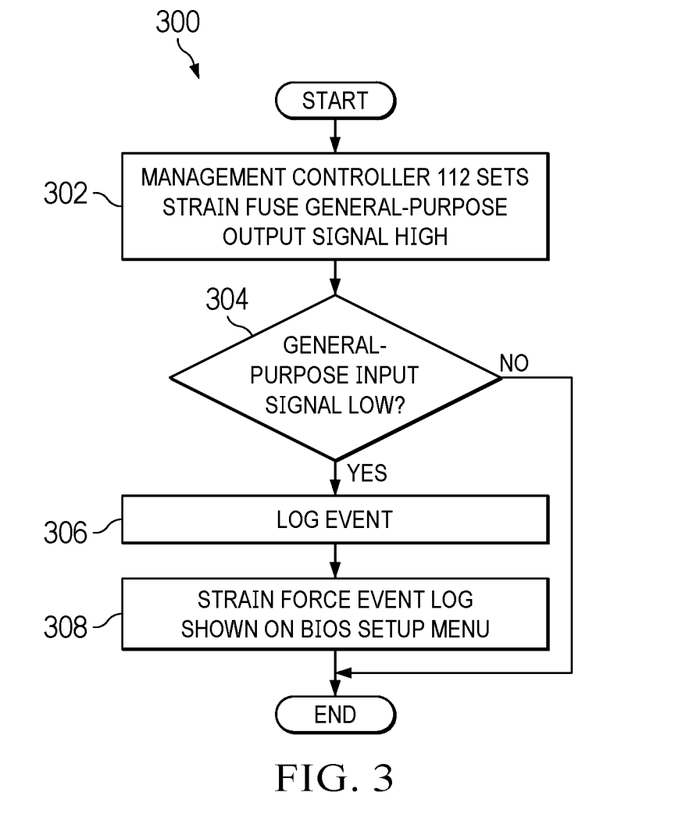
FIG. 3 illustrates a flow chart of an example method for detecting and processing a permanent fuse failure, in accordance with embodiments of the present disclosure.

FIG. 3 illustrates a flow chart of an example method 300 for detecting and processing a permanent fuse failure, in accordance with embodiments of the present disclosure. According to certain embodiments, method 300 may begin at step 302. As noted above, teachings of the present disclosure may be implemented in a variety of configurations of information handling system 102 as shown in FIG. 1. As such, the preferred initialization point for method 300 and the order of the steps comprising method 300 may depend on the implementation chosen. In these and other embodiments, method 300 may be implemented as firmware, software, applications, functions, libraries, or other instructions.

At step 302, management controller 112 may set its GPO pin to a known signal (e.g., logic high). At step 304, management controller 112 may determine if the known signal is received at its GPI pin. If the known signal (e.g., logic high) is received at the GPI pin, no impedance discontinuity exists within strain force fuses 116, and method 300 may end. Otherwise if the known signal is not received at the GPI pin (e.g., logic low is received), then an impedance discontinuity may exist within one or more strain force fuses 116, and method 300 may proceed to step 306.

At step 306, management controller 112 may log the strain force fuse event. As a result, at step 308, a basic input/output system (BIOS) setup menu may be invoked (e.g., at a subsequent startup or boot session of information handling system 102) notifying a user of information handling system 102 of the event and/or providing options to such user of how to remedy the event. After completion of step 308, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using information handling system 102, components thereof, or any other system such as that shown in FIG. 1 operable to implement method 300. In certain embodiments, method 300 may be implemented partially or fully in software and/or firmware embodied in computer-readable media.

Figure 4:
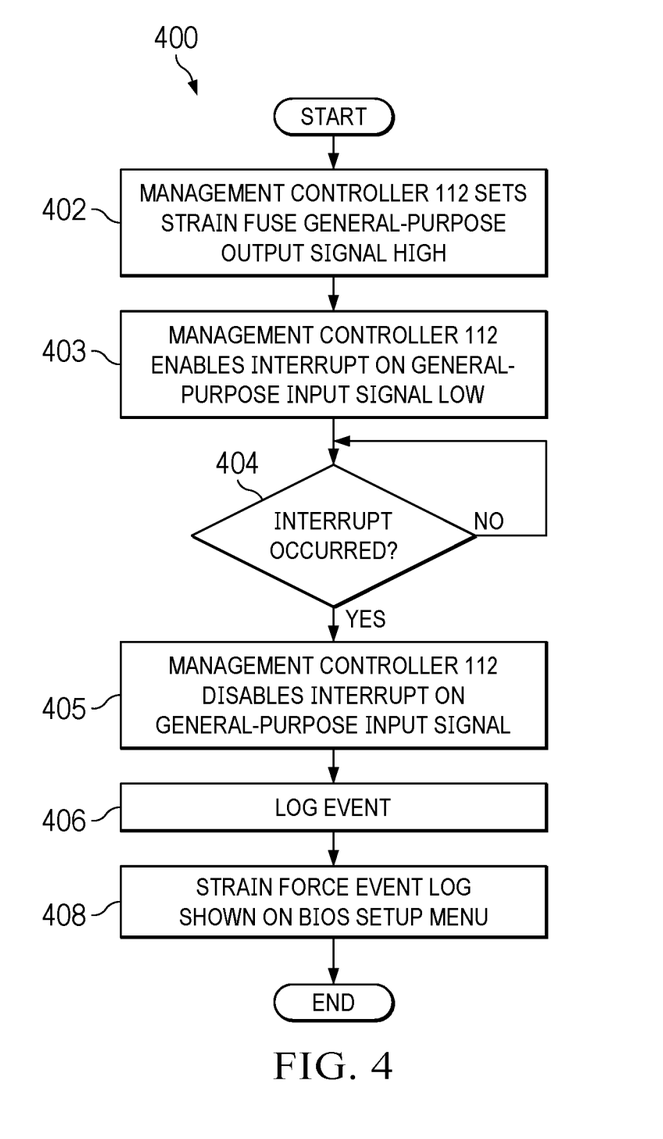
FIG. 4 illustrates a flow chart of an example method for detecting and processing an intermittent fuse failure, in accordance with embodiments of the present disclosure.

FIG. 4 illustrates a flow chart of an example method 400 for detecting and processing an intermittent fuse failure, in accordance with embodiments of the present disclosure. According to certain embodiments, method 400 may begin at step 402. As noted above, teachings of the present disclosure may be implemented in a variety of configurations of information handling system 102 as shown in FIG. 1. As such, the preferred initialization point for method 400 and the order of the steps comprising method 400 may depend on the implementation chosen. In these and other embodiments, method 400 may be implemented as firmware, software, applications, functions, libraries, or other instructions.

At step 402, management controller 112 may set its GPO pin to a known signal (e.g., logic high). At step 403, management controller 112 may enable itself to generate an interrupt if the known signal is not received at its GPI pin (e.g., logic low is received). At step 404, management controller 112 may determine if the interrupt has occurred. If the interrupt has not occurred, meaning that the known signal (e.g., logic high) is received at the GPI pin, no impedance discontinuity exists within strain force fuses 116, and method 400 may remain at step 404 until such interrupt occurs. Otherwise, if the interrupt occurs, indicating that the known signal is not received at the GPI pin (e.g., logic low is received), then an impedance discontinuity may exist within one or more strain force fuses 116, and method 400 may proceed to step 405.

At step 405, in response to the interrupt, management controller 112 may disable the interrupt on its GPI pin. At step 406, management controller 112 may log the strain force fuse event. As a result, at step 408, a basic input/output system (BIOS) setup menu may be invoked (e.g., at a subsequent startup or boot session of information handling system 102) notifying a user of information handling system 102 of the event and/or providing options to such user of how to remedy the event. After completion of step 408, method 400 may end.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using information handling system 102, components thereof, or any other system such as that shown in FIG. 1 operable to implement method 400. In certain embodiments, method 400 may be implemented partially or fully in software and/or firmware embodied in computer-readable media.

Although FIGS. 1 and 2 depict a particular and implementation of a strain force fuse 116, other implementations of strain force fuses 116 may be used in accordance with the teachings of the present disclosure. An example of another implementation of a strain force fuse is shown in FIGS. 5 and 6 and described below.

Figure 5:
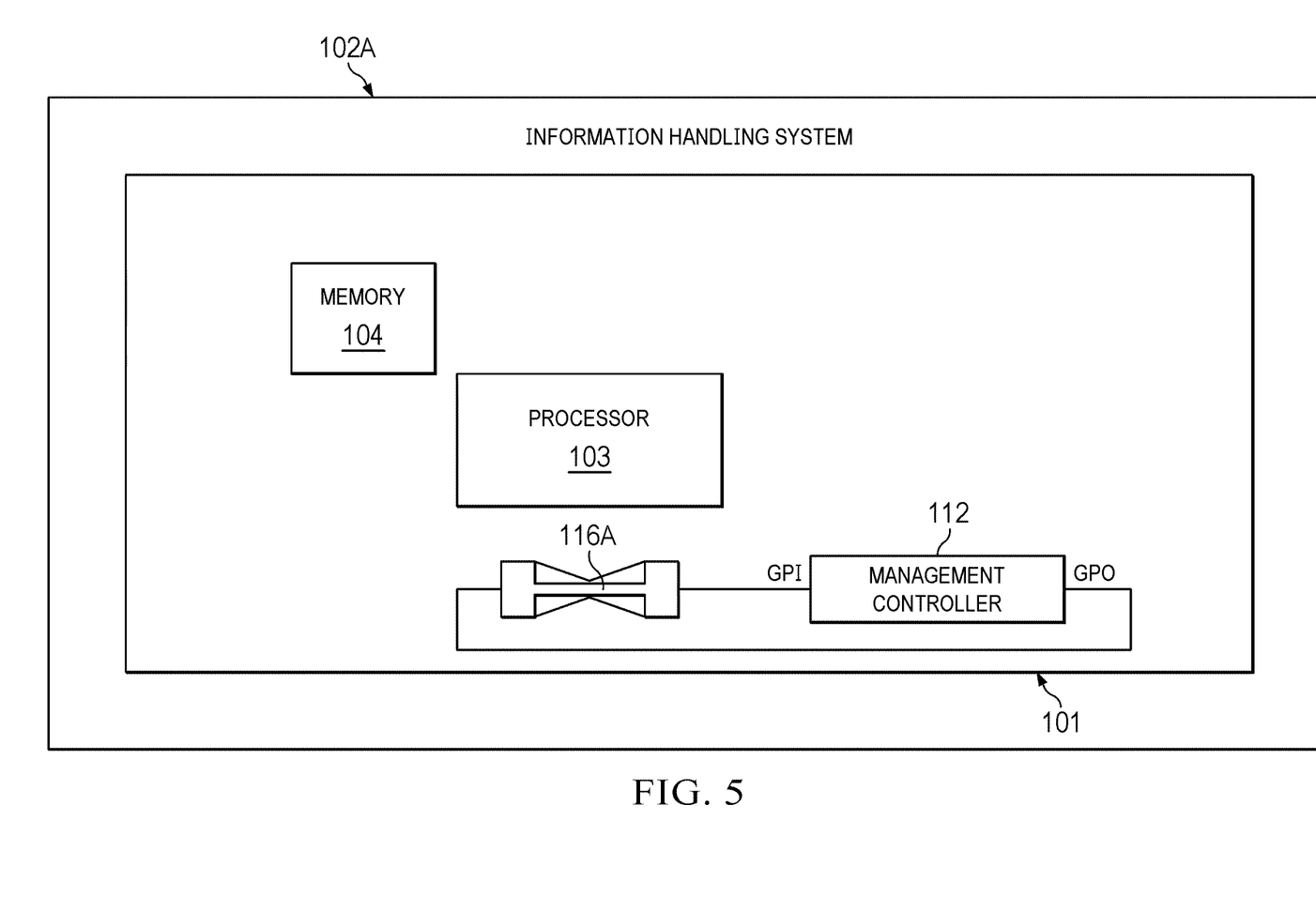
FIG. 5 illustrates a block diagram of selected components of another example information handling system, in accordance with certain embodiments of the present disclosure.
Figure 6:
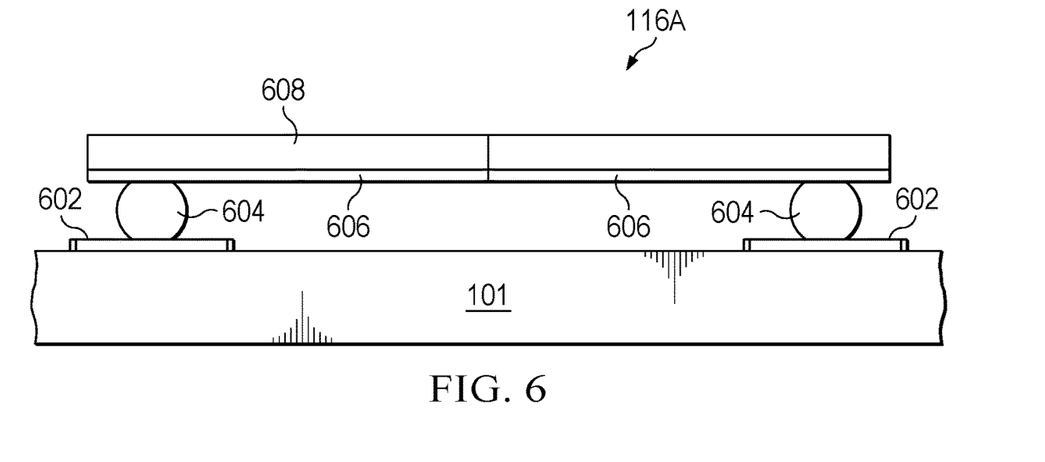
FIG. 6 illustrates a side elevation view of selected components of a strain force fuse formed on a circuit board, in accordance with certain embodiments of the present disclosure.

FIG. 5 illustrates a block diagram of selected components of another example information handling system 102A, in accordance with certain embodiments of the present disclosure. Information handling system 102A depicted in FIG. 5 is similar in many respects to information handling system 102 depicted in FIG. 1, and thus, only certain differences between information handling system 102A and information handling system 102 may be described below.

In particular, information handling system 102A may include one or more strain force fuses 116A in lieu of (or in addition to) strain force fuses 116 depicted in FIGS. 1 and 2. FIG. 6 illustrates a top plan view of selected components of strain force fuse 116A formed on circuit board 101, in accordance with certain embodiments of the present disclosure. As shown in FIG. 6, strain force fuse 116A may be formed by depositing a solder ball 604 (e.g., a ball grid array ball) on each of two opposite pads 602, and supporting a fragile substrate 608 (e.g., glass, glass fiber) on top of solder balls 604, such glass substrate 608 having an electrically conductive layer 606 formed underneath that electrically couples solder balls 604 (and thus pads 602) to one another. In the event of a mechanical strain or torsion event at or near strain force fuse 116A, fragile substrate 608 may break, thus also causing an impedance discontinuity (e.g., open circuit) in electrically conductive layer 606. In addition or alternatively, in the event of a mechanical strain or torsion event at or near strain force fuse 116A, one or both of solder balls 604 may break, also causing an impedance discontinuity. Any of such impedance discontinuities may be sensed by management controller 112 in a manner similar or identical to that described above with respect to strain force fuse 116.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a strain force fuse formed on a circuit board of the information handling system, the strain force fuse configured to experience an impedance discontinuity in response to a mechanical force applied to the circuit board at or proximate to the strain force fuse, wherein the strain force fuse comprises:
   a first pad formed in the circuit board;
   a second pad formed in the circuit board;
   a first solder ball deposited on the first pad;
   a second solder ball deposited on the second pad;
   a fragile substrate suspended between the first solder ball and the second solder ball; and
   an electrically conductive layer formed on the fragile substrate electrically coupling the first solder ball to the second solder ball, such that the impedance discontinuity comprises a break in one or more of the fragile substrate, the first solder ball, and the second solder ball.

2. The information handling system of claim 1, further comprising a management controller electrically coupled to the strain force fuse and configured to provide out-of-band management facilities for management of the information handling system, the management controller further configured to detect whether the impedance discontinuity has occurred.

3. The information handling system of claim 2, wherein the management controller is further configured to log an event associated with the occurrence of the impedance discontinuity.

4. The information handling system of claim 2, wherein the management controller is further configured to:
   output a known signal on a first pin of the management controller electrically coupled to the strain force fuse;
   receive an input signal on a second pin of the management controller electrically coupled to the strain force fuse; and
   determine if the impedance discontinuity exists based on whether the input signal is equivalent to the known signal.

5. The information handling system of claim 4, wherein:
   the first pin is a general-purpose output pin of the management controller; and
   the second pin is a general-purpose input pin of the management controller.

6. The information handling system of claim 1, wherein the strain force fuse is one of a plurality of strain force fuses coupled electrically in a series configuration.

7. A method comprising:
   outputting a known signal on a first pin of a management controller electrically coupled to a strain force fuse formed on a circuit board of an information handling system, the strain force fuse configured to experience an impedance discontinuity in response to a mechanical force applied to the circuit board at or proximate to the strain force fuse;
   receiving an input signal on a second pin of the management controller electrically coupled to the strain force fuse; and
   determining if the impedance discontinuity exists based on whether the input signal is equivalent to the known signal;
   wherein the strain force fuse comprises:
   a first pad formed in the circuit board;
   a second pad formed in the circuit board;
   a first solder ball deposited on the first pad;
   a second solder ball deposited on the second pad;
   a fragile substrate suspended between the first solder ball and the second solder ball; and
   an electrically conductive layer formed on the fragile substrate electrically coupling the first solder ball to the second solder ball, such that the impedance discontinuity comprises a break in one or more of the fragile substrate, the first solder ball, and the second solder ball.

8. The method of claim 7, wherein:
   the first pin is a general-purpose output pin of the management controller; and
   the second pin is a general-purpose input pin of the management controller.

9. The method of claim 7, wherein the strain force fuse is one of a plurality of strain force fuses electrically coupled in a series configuration.

10. The method of claim 7, further comprising the management controller logging an event associated with the occurrence of the impedance discontinuity.

11. An article of manufacture comprising:
    a non-transitory computer readable medium; and
    computer-executable instructions carried on the computer readable medium, the instructions readable by a processor, the instructions, when read and executed, for causing the processor to, in a management controller of an information handling system, wherein the management controller is configured to provide out-of-band management facilities for management of the information handling system:
    output a known signal on a first pin of the management controller electrically coupled to a strain force fuse formed on a circuit board of the information handling system, the strain force fuse configured to experience an impedance discontinuity in response to a mechanical force applied to the circuit board at or proximate to the strain force fuse;
    receive an input signal on a second pin of the management controller electrically coupled to the strain force fuse; and
    determine if the impedance discontinuity exists based on whether the input signal is equivalent to the known signal;

wherein the strain force fuse comprises:
- a first pad formed in the circuit board;
- a second pad formed in the circuit board;
- a first solder ball deposited on the first pad;
- a second solder ball deposited on the second pad;
- a fragile substrate suspended between the first solder ball and the second solder ball; and
- an electrically conductive layer formed on the fragile substrate electrically coupling the first solder ball to the second solder ball, such that the impedance discontinuity comprises a break in one or more of the fragile substrate, the first solder ball, and the second solder ball.

12. The article of claim 11, wherein:
the first pin is a general-purpose output pin of the management controller; and
the second pin is a general-purpose input pin of the management controller.

13. The article of claim 11,
wherein the strain force fuse is one of a plurality of strain force fuses electrically coupled in a series configuration.

14. The article of claim 11, the instructions for further causing the processor to log an event associated with the occurrence of the impedance discontinuity.

\* \* \* \* \*